United States Patent [19]
Ajit et al.

[11] Patent Number: 5,557,127
[45] Date of Patent: Sep. 17, 1996

[54] TERMINATION STRUCTURE FOR MOSGATED DEVICE WITH REDUCED MASK COUNT AND PROCESS FOR ITS MANUFACTURE

[75] Inventors: Janardhanan S. Ajit, Redondo Beach; Daniel M. Kinzer, El Segundo, both of Calif.

[73] Assignee: International Rectifier Corporation, El Segundo, Calif.

[21] Appl. No.: 409,347

[22] Filed: Mar. 23, 1995

[51] Int. Cl.$^6$ .............................. H01L 29/78; H01L 29/40
[52] U.S. Cl. ........................ 257/339; 257/491; 257/355
[58] Field of Search ................................ 257/339, 355, 257/491, 492, 173, 496

[56] References Cited

U.S. PATENT DOCUMENTS

| | | | |
|---|---|---|---|
| 4,468,686 | 8/1984 | Rosenthal | 357/53 |
| 4,567,502 | 1/1986 | Nakagawa et al. | 257/339 |
| 5,089,864 | 2/1992 | Sakurai | 257/339 |

FOREIGN PATENT DOCUMENTS

| | | | |
|---|---|---|---|
| 63-173373 | 7/1988 | Japan | 257/339 |
| 4-212469 | 8/1992 | Japan | 257/339 |

*Primary Examiner*—Donald L. Monin, Jr.
*Attorney, Agent, or Firm*—Ostrolenk, Faber, Gerb & Soffen, LLP

[57] ABSTRACT

A termination structure for a MOSgated device uses a plurality of series-connected lateral P-MOS devices extending in series, from source to drain of the main device. The P-MOS devices are formed in ring fashion around the periphery of the area being terminated. A plurality of concentric spaced P rings diffused into an N type chip termination area are covered by the main device gate oxide which is, in turn, covered with conductive polysilicon to act as a gate for the P-MOS devices so formed. The innermost P ring of each pair of P rings is connected to its gate to prevent turn on of the N channel device. The breakdown voltage of the termination is the sum of the threshold voltage of the P-MOS transistors. A zener diode can be added to the chain to increase the breakdown voltage of the termination.

18 Claims, 2 Drawing Sheets

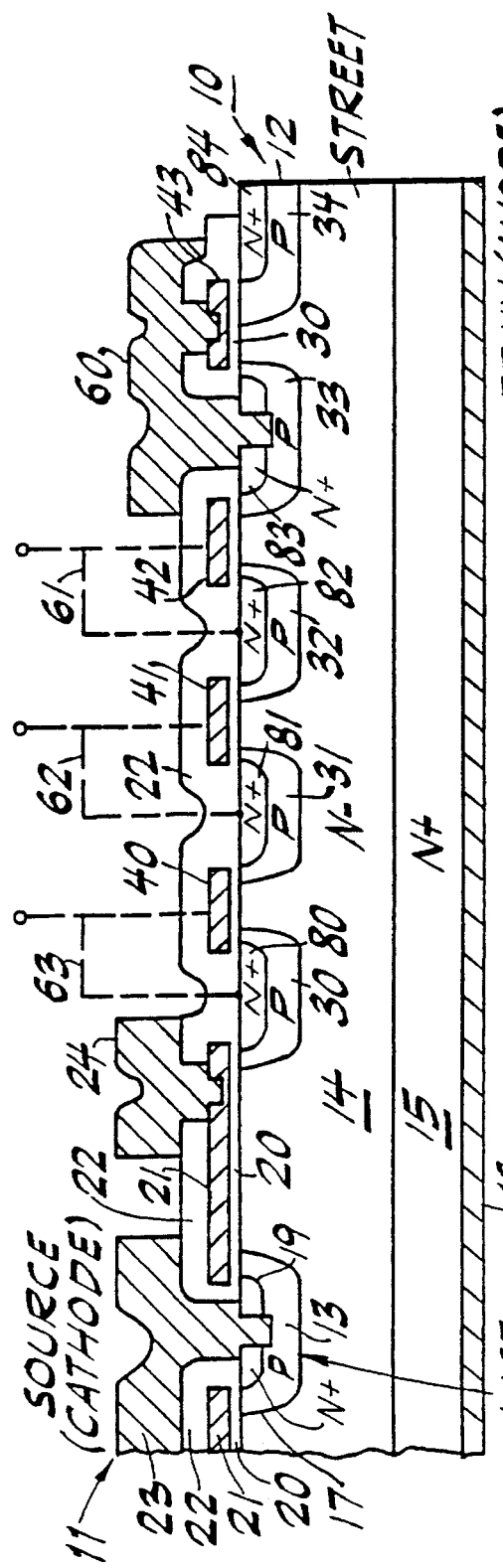
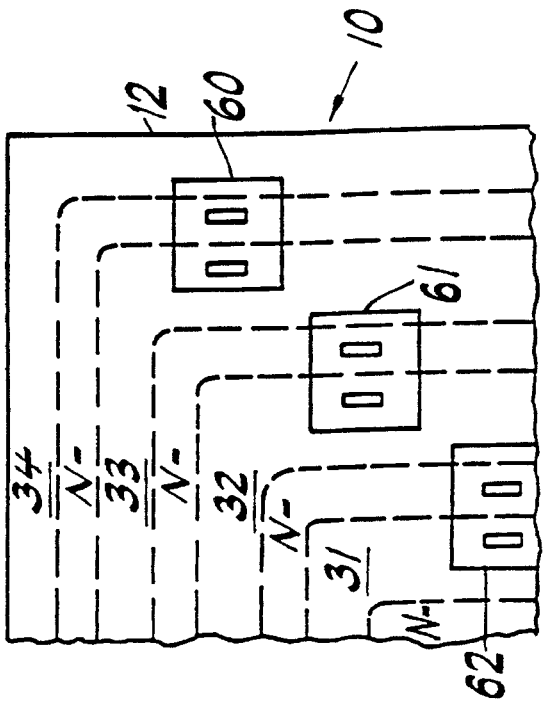

TERMINATION STRUCTURE FOR MOSGATED DEVICE WITH REDUCED MASK COUNT AND PROCESS FOR ITS MANUFACTURE

RELATED APPLICATIONS

This application is related to application Ser. No. 08/299,533, filed Sep. 1, 1994, in the name of Kinzer.

BACKGROUND OF THE INVENTION

This invention relates to a termination structure for MOSgated devices, and more specifically relates to a termination structure which can be manufactured using the same masks used to make the active area of such MOSgated devices.

MOSgated devices, such as power MOSFETs, IGBTs, MOSgated thyristors and the like are well known. These devices require a termination structure which surrounds the device active area if a potential greater than about 20 volts will be produced between the outer boundary of the active area (the source or anode electrode) and the edge of the chip (the drain or anode electrode). Moreover, the potential variation along the length of the termination should change as linearly as possible.

Multiple field plates and diffusion rings have been used alone and in various combinations for this termination structure as shown, for example, in U.S. Pat. No. 4,468,686, dated Aug. 28, 1984, in the name of Rosenthal. Such field terminations, however, require added unique process steps to form the termination and a large area of the chip has been devoted to the termination.

A termination structure which uses a smaller area and does not require added masking or process steps over those needed to form the main device is very desirable.

BRIEF DESCRIPTION OF THE INVENTION

In accordance with the present invention, P-MOS transistors are arranged in series with one another from source to drain (or from cathode to anode) to form a termination structure. The P-MOS transistors may be formed of concentric rings surrounding the device active area or may have any other desired topology. The maximum voltage which can be supported by each of these P-MOS transistors is equal to their threshold voltage. The threshold voltage of these P-MOS transistors depends mainly on gate insulator thickness, the "back-gate" bias, the epitaxial layer doping and the gate material. A high back-gate bias for devices in high voltage circuits increases the magnitude of the threshold voltage of the P-MOS transistors.

The potential varies along the series circuit of P-MOS transistors uniformly, from the source to the drain. The breakdown voltage of the termination is the sum of the threshold voltages of all of the series-connected P-MOS transistors. A further increase in breakdown voltage can be obtained by forming a zener diode, for example, a 6 volt diode, at the high voltage side of the series connected transistors.

The termination structure of the invention can be employed to form the termination for devices manufactured as shown in copending application Ser. No. 08/299,533, referred to above, without requiring an added critical process step or added critical mask. However, it can be generally used with any MOSgated device structure, and will require no added process steps or masks, so long as the active device employs a P-well, a gate insulation and a gate electrode.

Note that the same oxide which defines the gate in the active area can define the oxide in the termination structure. While the invention is described herein in connection with an N channel device, it will be apparent that the concentration types can be reversed. When using a 3 mask process, an $N^+$ region which was formed during the step forming the source will be formed in each P ring. This $N^+$ region of each ring is shorted to the next gate to deactivate the $N^+$ region in the termination, and may also be shorted to its P region to deactivate the parasitic bipolar transistor formed with the $N^+$ region.

Other features and advantages of the present invention will become apparent from the following description of the invention which refers to the accompanying drawings.

BRIEF DESCRIPTION OF THE DRAWINGS

FIG. 1 shows a cross-section of the termination structure of the present invention.

FIG. 2 is a top view of a portion of the chip containing the novel termination structure.

DETAILED DESCRIPTION OF EMBODIMENTS OF THE INVENTION

Figure 3:
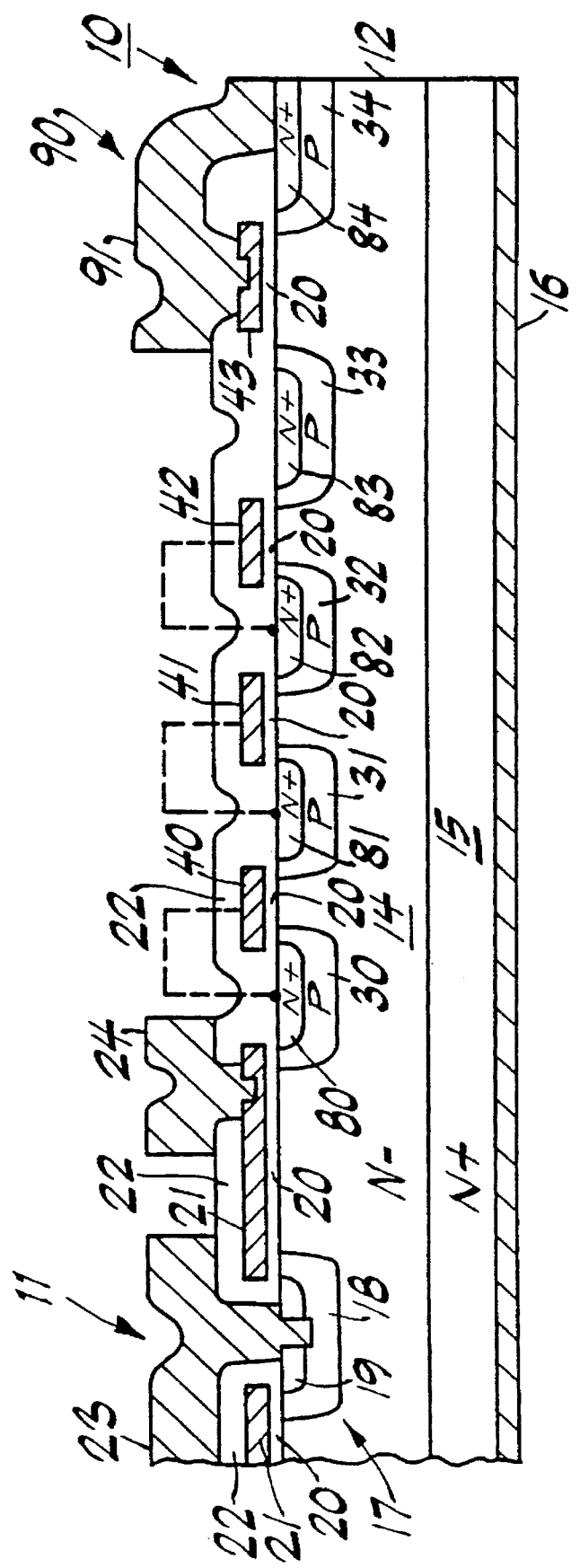
FIG. 3 shows the termination structure of FIG. 1 with an added zener diode.

Referring first to FIG. 1, there is shown a portion of the edge structure of a power MOSFET 10, from the end of the active area 11 of the device, to its edge 12. The active area may define any desired MOSgated device, and can be a structure such as that described in U.S. Pat. No. 5,008,725, or copending application Ser. No. 08/299,533, noted above.

The termination structure is formed in the $N^-$ body 14 of epitaxial silicon, which is atop the $N^+$ substrate 15. A drain electrode 16 (or anode electrode, if the active device is an IGBT or a MOSgated thyristor) is connected to the bottom of body 15.

The active area of the device can have any desired topology and could, for example, consist of symmetrically spaced polygonal cells. The outermost active cell 17 of the active area is shown in FIG. 1, and consists of the polygonal P type base 18 and $N^+$ source region 19. A gate oxide layer 20 covers the channel region formed between P base 18 and source region 19 and a polysilicon gate 21 overlies the gate oxide 20. An interlayer oxide 22 is used to insulate gate 21 as usual. The full active area of the device can be formed of a field of identical symmetrically arranged cells 17. Alternatively, an interdigitated structure, can be used for the active area. Whichever topology is used, a source (or cathode) electrode 23 will extend to the edge of the active area. Source electrode 23 in FIG. 1 penetrates the $N^+$ source 19 and contacts the P body 18 as described in copending application Ser. No. 08/299,533. FIG. 1 also shows a metal gate bus 24 attached to the polysilicon gate lattice 21.

During device operation, source electrode 23 will be at or close to ground potential and the drain electrode 16 will be at a higher potential. For example, the potential of drain 16 which may be more than about 20 volts higher than that of the source. The drain potential will appear at the edge 12 of the chip due to conduction along the unpolished surface of street 12 or due to intentional metallization, not shown, connected from electrode 16 to the top of the chip.

To properly terminate the chip active area, it is necessary to grade the potential as linearly as possible along the chip edge (to avoid local high field stress) from region 11 to street or edge 12, and to minimize the area needed for this termination.

In accordance with the present invention, the termination is formed by a series of P-MOS diodes connected from region 11 to edge 12, with the voltage drop across each P-MOS device generally linearly grading the potential along the surface of the silicon 14. These P-MOS devices can be conveniently formed during the manufacture of the active devices, so long as the active cells such as cell 17 require a P diffusion, a gate insulation and a gate electrode. If so, the termination does not require an added critical process or critical mask step.

Thus, in FIGS. 1 and 2, a plurality of P type concentric spaced rings 30, 31, 32, 33 and 34 encircle the active area 11 of the chip. The number of rings used depends on the number of P-MOS devices needed in series to form the termination. Each of rings 30 to 34 contain $N^+$ source type regions 80 to 84 respectively, formed during the formation of the sources of the active device when using the process of copending application Ser. No. 08/299,533. These source rings 80 to 85 can be eliminated if desired, by the use of a non-critical mask step during the manufacturing process.

Rings 30 to 34 are concentrically spaced from one another by $N^-$ gaps. These $N^-$ gaps are covered by gate oxide layers 30, formed when the gate Oxide of the active area is formed and having the same thickness as the gate oxide. Spaced conductive polysilicon rings 40 to 43 are formed atop oxide 30 when the polysilicon gate 21 is deposited and patterned while making the active device. The polysilicon rings 40 to 43 are defined during the main polysilicon gate etch step, used in all MOS gate-making processes.

Rings 40, 41, 42 and 43 have notches partially through their thicknesses. These notches are inherently formed during the silicon etch process of copending application Ser. No. 08/299,533 which enables the contact 23 to connect and deactivate $N^+$ source 19 to P type body 18 for each active cell and are not necessary for the termination of the present invention.

Polysilicon gate rings 21, 40, 41, 42 and 43 define mask windows for the implantation and diffusion of P type ring shaped diffusions 30 to 34, which process steps take place simultaneously with the related steps for making the active device. These steps are shown in detail in copending application Ser. No. 08/299,533, the disclosure of which is incorporated herein by reference. Rings 40 to 43 are insulated by interlayer oxide 22 during that process step in making the active device.

During the contact etch process step, small openings are etched through the oxide over each of P rings 30 to 33 and over polysilicon rings 40 to 43. These openings are generally at a corner of the chip and are staggered from one another, and serve to receive small contacts which electrically connect the P rings 30, 31, 32 and 33 to the next outermost polysilicon ring 40, 41, 42 and 43, respectively. One such small square contact 60 is shown in FIGS. 1 and 2. Two other contacts 61 and 62 are shown in FIG. 2, which connect P rings 32 and 31 to polysilicon rings 42 and 41, respectively. Contacts 60, 61 and 62 are formed during the patterning of the aluminum source (cathode) contact and connection pads.

The resulting structure defines a plurality of lateral P-MOS devices connected in series between the active region 11 and edge 12. The connection of $N^+$ rings 80 to 83 to polysilicon gates 40 to 43 respectively fixes the gate to source potential to zero for each parasitic n-channel device and "deactivates" the $N^+$ regions.

The first P-MOS device is formed by spaced P type regions 30 and 31. Since the P-MOS drain 30 is connected to gate 40, the P-MOS device is turned on with the application of a drain to source voltage greater than the threshold voltage of this P-MOS device. The voltage drop across the P-MOS device is its threshold voltage, which may be about 6 volts. Thus, for a 40 volt active device, seven rings similar to those of FIGS. 1 and 2 would terminate the active structure with good linearity. Any number of devices with any desired threshold voltage could have been used. As stated before, the $N^+$ regions can be avoided by a non-critical masking step during manufacture.

For a typical device in FIG. 1, the P regions 30 to 34 may be formed by a boron implant of dose 5E13, followed by a diffusion at 1175° C. for 45 minutes. The P region depth is then about 1.5 microns. The thickness of gate oxide 20 is about 500 Å, the spacing between adjacent P rings is about 1.5–8.0 microns, and the width of each ring is about 1.5–3 microns. Thus, only a relatively small area is needed for the termination, while no added process steps or masking steps are needed.

FIG. 3 shows a further embodiment of the invention, where parts similar to those of FIG. 1 carry the same reference numerals. Note that the series connection of P-MOS transistors is schematically shown in FIG. 3. In FIG. 3, however, a zener diode 90 is formed at the high voltage side of the termination to further increase the breakdown voltage of the termination. The zener diode 90 is formed by $N^+$ region 83 within the boundaries of P type diffusion 33, and by causing the small conductive square contact 91 to contact the outermost P diffusion 34. In FIG. 3, region 83 may have a depth of about 0.3 microns and is formed during the formation of the source regions of the active devices. For example, region 83 can be formed by an arsenic implant at a dose of 1E16, followed by a diffusion of 975° C. for 60 minutes.

As previously stated, if desired, regions 80 to 84 in FIG. 3 can be eliminated by use of a non-critical masking step or the like during the device fabrication. As also stated previously, all concentration types can be reversed if desired.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A termination structure for a MOSgated device formed in a thin rectangular chip of silicon; said thin chip of silicon having an active area and having at least one main conductive electrode on one surface thereof; said termination structure bounding at least one portion of said active area and comprising a plurality of concentric lateral P-MOS transistor devices extending from a boundary of said active area and toward the edge of said chip; each of said plurality of P-MOS lateral transistors being formed in said one surface and connected in series with one another; each of said P-MOS transistors comprising respective concentric spaced P type diffusions; a gate oxide and an overlying conductive gate electrode spanning the space between each of said P type diffusions to define respective lateral P-MOS devices; said main conductive electrode being disposed adjacent to the one of said P type diffusions which is closest to said active area; each of said P type diffusions having a conductive member connecting it to the gate electrode which spans said last-mentioned P diffusion and the next adjacent P type diffusion which is positioned toward the outer edge of said chip; each of said P-MOS devices turning on when the voltage between said active area and the edge of said chip exceeds a given value; said P-MOS devices being connected in series with one another, whereby the potential between said conductive electrode at the boundary of said active area and the edge of said chip is divided across said series-connected P-MOS devices; said active area of said chip including a plurality of active area MOSgated devices having P type diffusions, gate oxides and conductive gate electrodes; said P diffusions of said active devices and of said P-MOS devices respectively and said gate oxides of said active devices and said P-MOS devices respectively, and said conductive gate electrodes of said active devices and said P-MOS devices respectively being formed in the same respective process steps.

2. The device of claim 1 which further includes a zener diode at the end of said series-connected P-MOS devices at the edge end of said chip.

3. The device of claim 1 wherein each of said conductive members is disposed in a corner of said thin rectangular chip of silicon.

4. The device of claim 1 wherein said P diffusions of said P-MOS devices have a depth of about 1.5 microns, and a spacing of about 1.5–8 microns.

5. The device of claim 3 wherein said P diffusions of said P-MOS devices have a depth of about 1.5 microns, and a spacing of about 1.5–8 microns.

6. The device of claim 2 wherein said zener diode consists of an N type diffusion within the P type diffusion which is next adjacent said chip edge; the gate electrode spanning the outermost two of said P type diffusions connected to the outer edge of said chip.

7. The device of claim 1 wherein there are greater than three P rings concentrically disposed with respect to one another.

8. The device of claim 2 wherein said P type diffusions consist of more than two P type diffusions concentrically disposed and radially spaced with respect to one another.

9. The device of claim 3 wherein said P type diffusions consist of more than two P type diffusions concentrically disposed and radially spaced with respect to one another.

10. The device of claim 4 wherein said P type diffusions consist of more than two P type diffusions concentrically disposed and radially spaced with respect to one another.

11. The device of claim 1 wherein each of said P type diffusions contains a shallow $N^+$ diffusion; said $N^+$ diffusions being connected to a respective one of said conductive members which connects the P region containing said respective $N^+$ diffusion to an adjacent one of said gate electrodes.

12. The device of claim 1 wherein said conductive members are connected to the surfaces of respective ones of said P type diffusions.

13. The device of claim 11 which further includes a zener diode at the end of said series-connected P-MOS devices at the edge end of said chip.

14. The device of claim 12 which further includes a zener diode at the end of said series-connected P-MOS devices at the edge end of said chip.

15. A termination structure for a MOSgated device formed in a thin rectangular chip of silicon; said thin chip of silicon having an active central area and having at least one main conductive electrode on one surface thereof; said termination structure bounding at least one portion of said active area and comprising a plurality of series-connected lateral MOS transistors extending from a boundary of said active area and toward the edge of said chip; each of said plurality of lateral MOS transistors being formed in said one surface and connected in series; each of said lateral MOS transistors comprising respective diffusions of one conductivity type in a substrate of the other conductivity type and spaced from one another; a gate oxide and an overlying conductive gate electrode spanning the space between each of said diffusions to define respective ones of lateral MOS transistors; said main conductive electrode disposed adjacent the one of said diffusions which is closest to said active area; each of said diffusions having a conductive member connecting it to the gate electrode which spans said last-mentioned diffusion and the next adjacent diffusion which is positioned toward the outer edge of said chip; each of said lateral MOS transistors turning on when the voltage between said active area and the edge of said chip exceeds a given value; said lateral MOS transistors being connected in series with one another, whereby the potential between said conductive electrode at the boundary of said active area and the edge of said chip is divided across said series-connected lateral MOS transistors; and a junction pattern at the end of said series-connected lateral MOS devices which defines a zener diode in said series-connected devices.

16. The device of claim 15 wherein each of said conductive members is disposed in a corner of said thin rectangular chip of silicon.

17. The device of claim 15 wherein there are greater than three diffusions concentrically disposed with respect to one another.

18. The device of claim 16 wherein there are greater than three diffusions concentrically disposed with respect to one another.

* * * * *